United States Patent
Gao et al.

(10) Patent No.: US 8,427,209 B2
(45) Date of Patent: Apr. 23, 2013

(54) SAMPLING PHASE LOCK LOOP (PLL) WITH LOW POWER CLOCK BUFFER

(71) Applicant: National Semiconductor Corporation, Santa Clara, CA (US)

(72) Inventors: Xiang Gao, Freemont, CA (US); Ahmad Bahai, Lafayette, CA (US); Mounir Bohsali, Alamo, CA (US); Ali Djabbari, Saratoga, CA (US); Eric Klumperink, Lichtenvoorde (NL); Bram Nauta, Enschede (NL); Gerard Socci, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/654,051

(22) Filed: Oct. 17, 2012

(65) Prior Publication Data

US 2013/0038365 A1 Feb. 14, 2013

Related U.S. Application Data

(63) Continuation of application No. 12/973,323, filed on Dec. 20, 2010.

(51) Int. Cl.
*H03L 7/06* (2006.01)

(52) U.S. Cl.
USPC .......................... 327/156; 327/147

(58) Field of Classification Search .................. 327/147, 327/156
See application file for complete search history.

(56) References Cited

U.S. PATENT DOCUMENTS

| | | | |
|---|---|---|---|
| 7,737,743 B1 * | 6/2010 | Gao et al. ........... | 327/158 |
| 7,990,194 B2 * | 8/2011 | Shim ..................... | 327/158 |
| 8,253,455 B2 * | 8/2012 | Hyun et al. .......... | 327/147 |
| 2008/0218274 A1 * | 9/2008 | Clementi ............. | 331/16 |
| 2012/0154003 A1 * | 6/2012 | Gao et al. ............ | 327/159 |

* cited by examiner

*Primary Examiner* — Adam Houston
(74) *Attorney, Agent, or Firm* — Andrew S. Viger; Wade J. Brady, III; Frederick J. Telecky, Jr.

(57) ABSTRACT

A sampling phase locked loop (PLL) circuit includes a pull-up/down buffer configured to convert an oscillator reference clock into a square wave sampling control signal input to a sampling phase detector. The buffer circuit is configured to reduce power by controlling the switching of the pull-up and pull-down transistors (and thereby the transitions of the sampling control signal) so that the transistors are not on at the same time.

26 Claims, 6 Drawing Sheets

SAMPLING PHASE LOCK LOOP (PLL) WITH LOW POWER CLOCK BUFFER

CROSS-REFERENCE TO RELATED APPLICATIONS

This Application is a continuation of U.S. application Ser. No. 12/973,323, filed Dec. 20, 2010, which is now U.S. Pat. No. 8,395,427.

The following patent application is related and hereby incorporated by reference: U.S. application Ser. No. 12/973,353, now U.S. Pat. No. 8,373,481, which was filed simultaneously with U.S. application Ser. No. 12/973,323.

BACKGROUND

1. Field

The present invention relates to sampling phase lock loops, in a particular, to control circuitry for sampling phase lock loops for reducing power consumption and spurious output signals.

2. Related Art

Referring to FIG. 1, a conventional phase lock loop (PLL) 10 includes a sampling phase detector 12, followed by a charge pump 14, a low pass filter 16 and a controllable signal source 18, typically a voltage controlled oscillator (VCO). An external reference signal source 20, often in the form of a crystal oscillator, provides a reference signal 21 which is buffered by a buffer amplifier 22 to convert the sine wave input signal 21 to a square wave reference signal 23. In accordance with this buffered reference signal 23, the sampling phase detector 12 samples the VCO output signal 19. The sampled signal 13 drives the charge pump 14, the output of which is filtered by the low pass filter 16 to produce the DC control signal 17 for the VCO 18.

Referring to FIG. 2, the reference buffer circuit 22 is often implemented as an inverter circuit 22a (or multiple such inverters 22a connected in series). In accordance with well known principles, during positive extremes of the input signal 21, the NMOS transistor 30n is turned on and the PMOS transistor 30p is turned off. Conversely, during negative extremes of the input signal, the PMOS transistor 30p is turned on and the NMOS transistor 30n is turned off. This produces the output square wave signal 23 having negative and positive signal excursions, respectively. However, between such positive and negative signal extremes, both transistors 30p, 30n will be conductive.

Referring to FIG. 3, this implementation 22a of the buffer circuitry 22 draws a significant amount of current from the power supply VDD. In order to achieve low PLL output signal 19 jitter, large transistor sizes are required for low reference clock signal noise. Accordingly, the large transistors 30p, 30n required for the inverting buffer circuit 22a can dominate the power consumption of the overall sampling PLL circuitry. As seen in the Figure, when the input sine wave voltage 21 is higher than the NMOS transistor 30n threshold voltage $V_{th,N}$, the NMOS transistor 30n is conducting. When the input voltage 21 is lower than the power supply voltage VDD minus the PMOS transistor 30p threshold voltage VDD-$V_{th,P}$, the PMOS transistor 30p is conducting. Since the power supply voltage VDD is typically larger than the sum of the threshold voltages, there will be a time interval when both the NMOS 30n and PMOS 30p transistors are conducting. This results in a direct path current that flows from the power supply VDD to circuit ground GND. This direct path current is not fundamentally required for a circuit operation, and is, therefore, a waste of power. In some cases such direct path current can account for more than 90% of the total power for the inverter circuit 22a.

Referring to FIG. 4, the sampling circuitry 12 (FIG. 1) is typically implemented as a sampler circuit 12a having a series switch 40 and shunt capacitance 42. The switch 40 is opened and closed in accordance with the mutually opposed signal states of the square wave reference signal 23. This produces the sampled voltage 13 which is stored on the shunt capacitance 42 during the time intervals that the switch 40 is opened.

Referring to FIG. 5, the switching activity of such a sampler 12a tends to disturb operation of the VCO 18, thereby producing spurious output signals within the VCO output signal 19.

Referring to FIG. 6, in accordance with well known principles, differential circuitry can also be used as part of the PLL circuit 10. In such an implementation, the VCO 18d produces a differential output signal having mutually opposed positive 19p and negative 19n signal phases which are separately sampled by switches 40p, 40n controlled by the preferred reference signal 23, and stored on sampling capacitances 42p, 42n to produce positive 13p and negative 13n phases of a differential sampled signal voltage.

As noted above, the switch 40 (FIG. 4) is closed when the reference signal 23 is asserted (e.g., high) and open when the reference signal 23 is de-asserted (e.g., low). The sampling edge 23s is aligned in phase to a rising edge of the output signal 19. When the switch 40 is turned off, the sampled output voltage 13 is well defined and equal to the DC component of the VCO output voltage 19. This also means that when the switch 40 is turned on again the voltage 13 on the sampling capacitance 42 will be equal to this DC voltage component. However, the VCO voltage 19 at the moment that the switch 40 is turned on may not be equal to its DC component. This results in charge sharing between the output of the VCO 18 and the capacitance 42 in the sampler 12a.

In other words, the switching activity of the sampler 12a periodically changes the loading of the output of the VCO 18. During the on time of the switch 40, the VCO output is loaded by the sampling capacitance 42, while during the off time of the switch 40, the VCO is disconnected and not loaded by the sampling capacitance 42. This change in loading produces changes in the frequency of the VCO output signal 19. The switch 40 is often implemented with a MOS transistor operating in its triode region. When the transistor is turned on or off, the channel charge within the MOS transistor is built or released and absorbed from or injected into, respectively, the output of the VCO 18. This results in spurious output signals being generated within the VCO output signal 19. In radio receiver applications, such spurious signals mixes undesirably in the channel bandwidth, thereby degrading the signal-to-noise ratio (SNR), and in clock data recovery applications, such spurious signals translate to peak-to-peak jitter, thereby increasing the bit error rate (BER).

Accordingly, it would be desirable to provide better control of a sampling PLL such that power supply consumption is reduced and spurious output signals are minimized.

BRIEF SUMMARY

This Summary is provided as a brief introduction to the Disclosure set forth in the Detailed Description, Figures and Claims.

Aspects and technical features of the claimed circuit, method and system include adapting a pull-up/down buffer circuit for use in a sampling phase locked loop (PLL) that includes a sampling phase detector. The buffer circuitry is configured to convert a reference clock into a substantially square wave sampling control signal input to the sampling phase detector.

In one example embodiment, the buffer circuit is configured for controlling the switching of the pull-up and pull-down transistors, and thereby the transitioning of the sampling control signal, so that the transistors are not on at the same time. In another example embodiment, the sampling PLL further includes a delay locked loop (DLL) with a second sampling phase detector, and the buffer circuit is further configured for generating an inverse sampling control signal that controls the second sampling phase detector in generating a DLL control signal fed back to the buffer circuit for controlling the transitioning of sampling control signal (and thereby the inverse sampling control signal) such that the sampling duration of the sampling control signal is substantially an integer multiple of the period of the PLL output signal.

DETAILED DESCRIPTION

Figure 1:
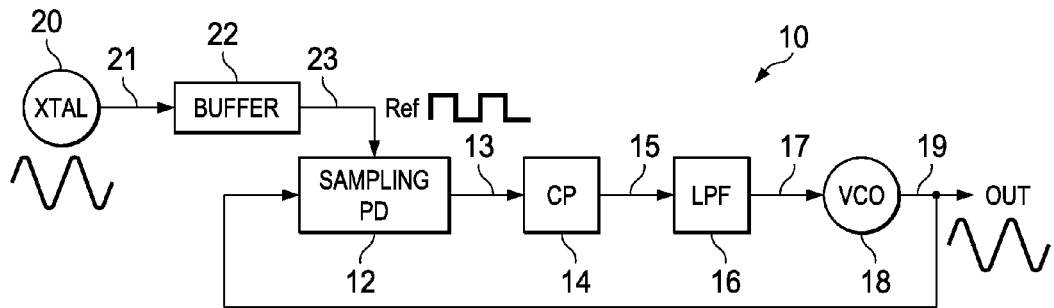
FIG. 1 is a functional block diagram of a conventional sampling PLL with its input reference buffer circuitry.
Figure 2:
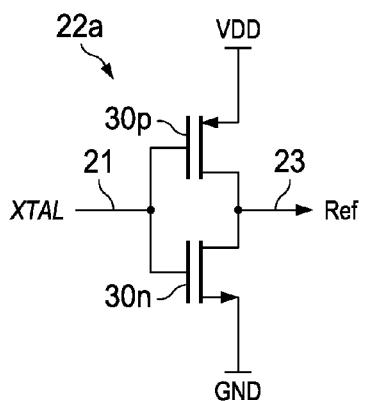
FIG. 2 is a schematic diagram of a conventional inverting reference buffer circuit.
Figure 3:
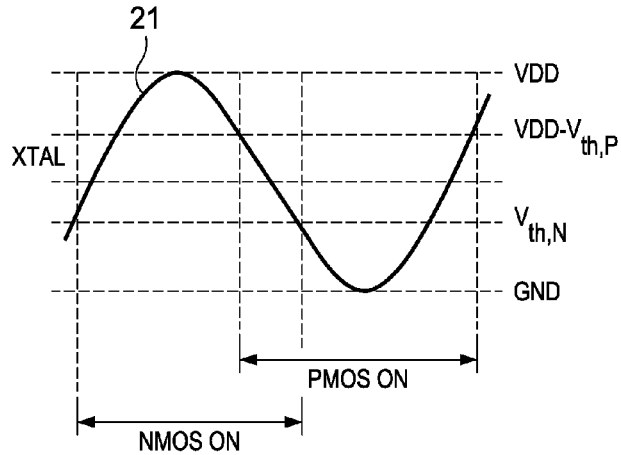
FIG. 3 is a signal timing diagram for the operation of the circuit of FIG. 2.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. To the extent that the figures illustrate diagrams of the functional blocks of various embodiments, the functional blocks are not necessarily indicative of the division between hardware circuitry.

In one example embodiment, a sampling PLL, including a sampling phase detector, is configured to generate a PLL output clock—the sampling phase detector is responsive to a sampling control signal to sample the PLL output clock and generate a PLL control signal used to phase lock the PLL output clock to an oscillator reference clock. The buffer circuit is configured to convert the reference clock into the sampling control signal with a substantially square wave duty cycle defined by a sampling edge and a signal edge which establish a sampling duration.

In this example embodiment, the buffer circuit includes (a) first and second transistors of respective first and second types coupled in series in a pull-up pull-down arrangement with a buffer output node between the transistors, and (b) a pulser circuit that receives the reference clock and is configured to generate a switch control pulse characterized by a switch-on edge and a pulse width, where (c) the first transistor receives at its control input the reference clock, and the second transistor receives at its control input the switch control pulse. The pulser circuit is configured (a) to introduce a controlled delay in the switch-on edge of the switch control pulse relative to the reference clock cycling through the threshold voltage of the second transistor, and (b) to control the pulse width of the switch control pulse. The buffer circuit including the pulser circuit is configured such that (a) the first transistor switches on in response to the reference clock cycling through its threshold voltage, thereby transitioning the buffer output node to generate the sampling edge of the sampling control signal, and (b) the second transistor switches on in response to the switch-on edge of the switch control pulse from the pulser circuit, thereby transitioning the buffer output node to generate the signal edge of the sampling control signal, and (c) the switch-on edge and pulse width of the switch control pulse are controlled such that the first and second transistors are not on at the same time.

In another example embodiment, the sampling PLL includes a delay locked loop (DLL) including a second sampling phase detector which samples the PLL output clock in response to an inverse sampling control signal. The buffer circuit is further configured to generate the inverse sampling control signal as the inverse of the sampling control signal such that the sampling edge, signal edge and sampling duration of the inverse sampling control signal correspond respectively to the signal edge, sampling edge and sampling duration of the sampling control signal. The second sampling phase detector samples the PLL output clock at the sampling edge of the inverse sampling control signal (corresponding to the signal edge of the sampling control signal) and provides a DLL control signal fed back to the buffer circuit. The pulser circuit is further responsive to the DLL control signal to correspondingly delay the switch-on edge of the switch control pulse, thereby controlling the signal edge of the sampling control signal, which corresponds to the sampling edge of the inverse sampling control signal, such that the sampling duration of the sampling control signal is substantially an integer multiple of the period of the PLL output signal.

Figure 4:
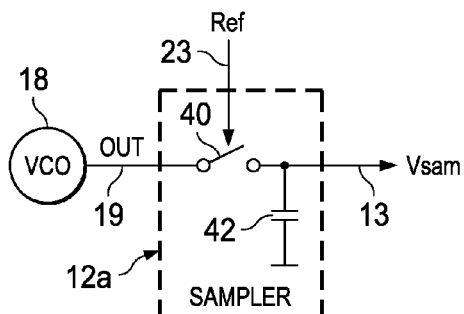
FIG. 4 is a schematic diagram of a conventional sampling circuit.
Figure 5:
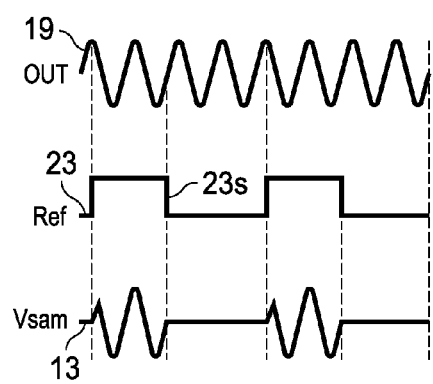
FIG. 5 is a signal timing diagram for the circuitry of FIG. 4.
Figure 6:
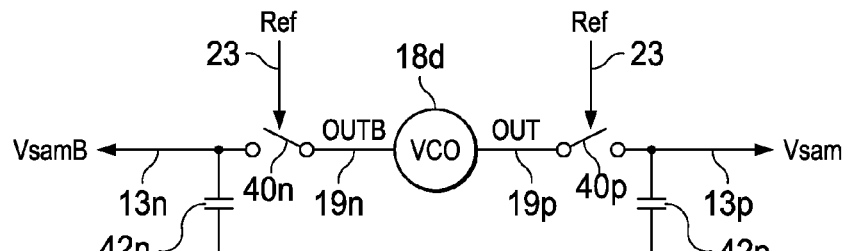
FIG. 6 is a schematic diagram of a differential embodiment of the sampler circuitry of FIG. 4.
Figure 7:
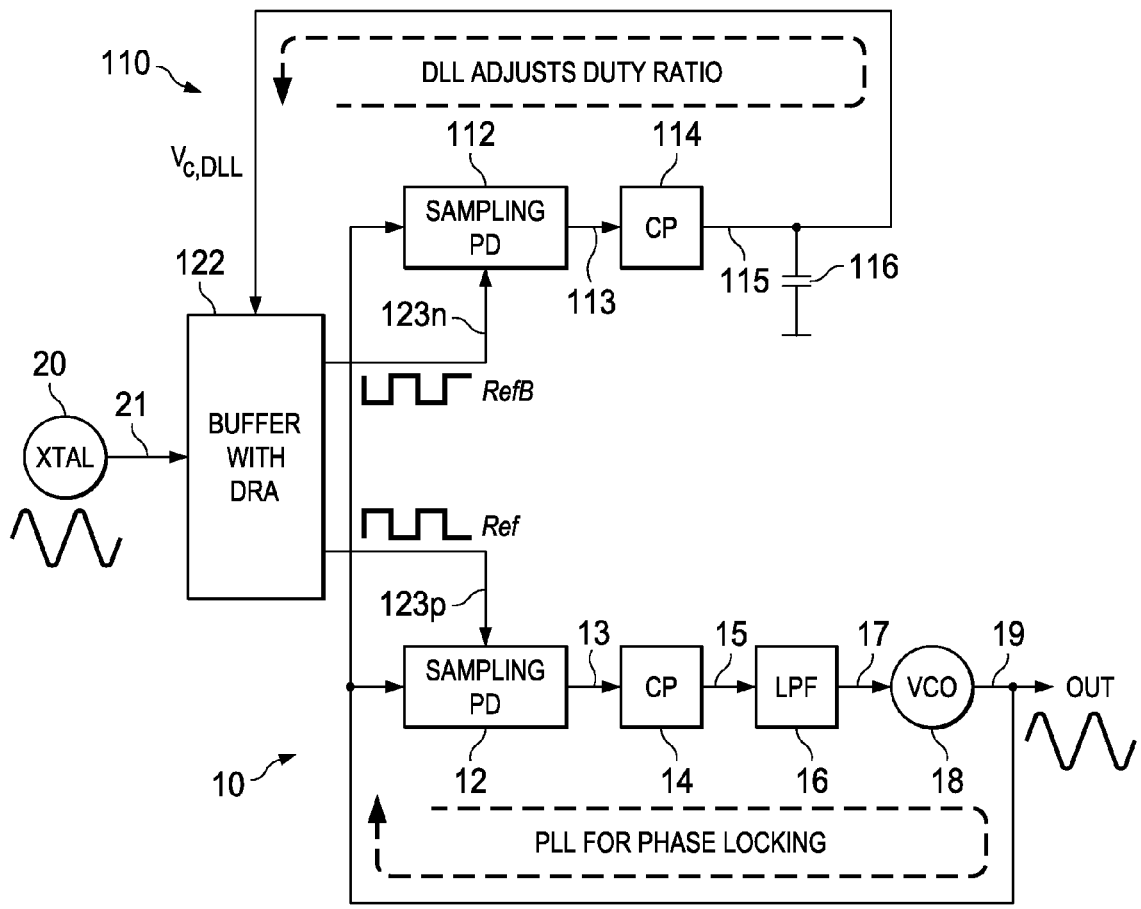
FIG. 7 is a functional block diagram of a sampling PLL driven by reference buffer circuitry in accordance with an exemplary embodiment.

Referring to FIG. 7, in accordance with an exemplary embodiment, the sampling PLL 10 is driven by a buffered reference signal 123p generated by buffer circuitry 122 including duty ratio adjustment (DRA) circuitry (discussed in more detail below), which, in turn, is controlled by a delay locked loop (DLL) 110. The DLL 110 includes a sampling phase detector 112 (e.g., a sampler 12a as depicted in FIG. 4), a charge pump 114 and low pass filter 116, similar to the sampling PLL 10. The filtered voltage 115 serves as the control signal for the buffer circuitry 122.

Figure 8:
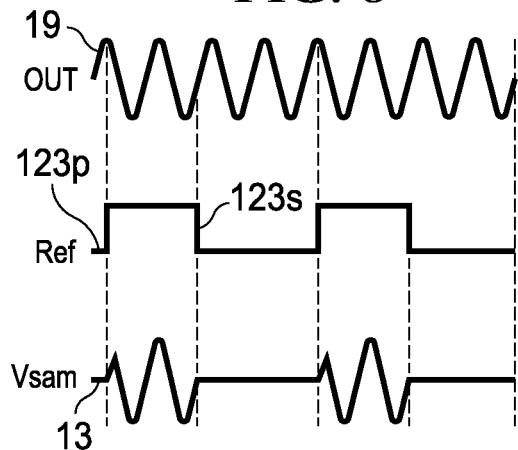
FIG. 8 is a signal timing diagram of the operation of a sampling circuit using a reference signal in accordance with an exemplary embodiment.

Referring to FIG. 8, as discussed in more detail below, the buffer circuitry 122 produces the reference signal 123p for the sampling PLL 10 and a related reference signal 123n for the DLL 110 such that the sampling duration, e.g., the duration of the asserted state of the reference signal 123p, is an integer multiple of the period of the VCO output signal 19. Accordingly, the instantaneous DC voltage component of the VCO output signal 19 is the same as the reference signal 123p transitions between its mutually opposed asserted and de-asserted signal states. As a result, charge sharing between the sampling capacitance 42 (FIG. 4) and the output stage of the VCO 18 is minimized, if not eliminated entirely.

Figure 9:
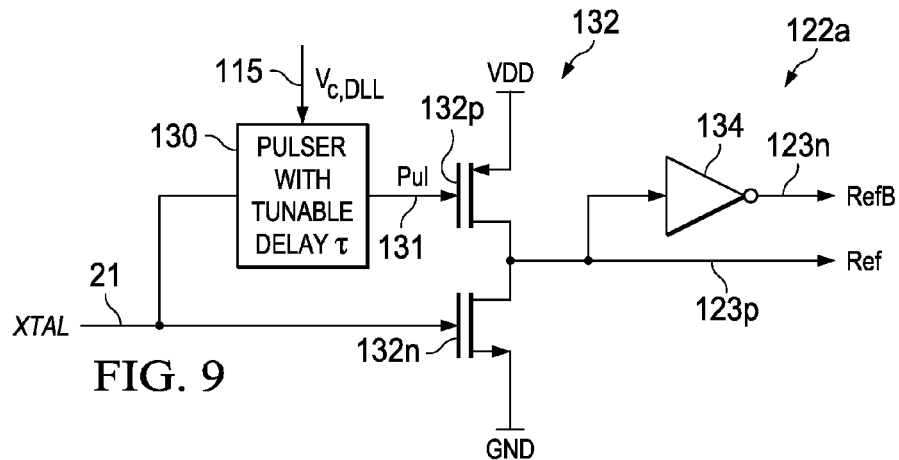
FIG. 9 is a schematic diagram of an exemplary embodiment of the buffer circuitry of FIG. 7.

Referring to FIG. 9, an example of the buffer circuitry 122 (labeled 122a) is shown. Buffer circuitry 122a, in this example, includes pulser circuitry 130, an inverting buffer 132 implemented with PMOS 132p and NMOS 132n transistors, and logic inverter circuitry 134. The pulser circuitry 130 has a tunable delay which is controlled by the output signal 115 of the DLL 110. The resulting signal pulse 131 drives the PMOS transistor 132p of the inverting buffer 132, while the original reference signal 21 drives the NMOS transistor 132n. The output of the inverting buffer circuitry 132 serves as the sampling control signal 123p for the sampling PLL 10, while its inverse serves as the sampling control signal 123n for the DLL 110.

Figure 10:
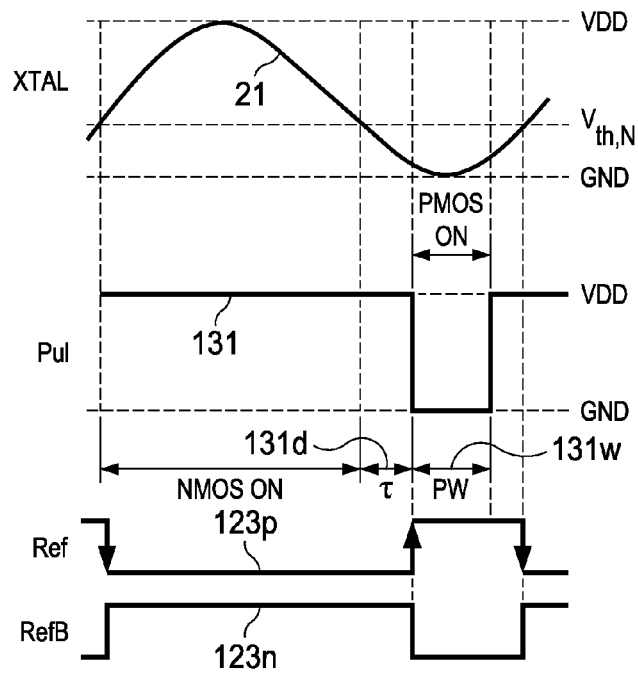
FIG. 10 is a signal timing diagram for the circuitry of FIG. 9.

Referring to FIG. 10, as a result, the sampling PLL control signal 123p and DLL control signal 123n ensure that the duty ratio of such signals 123p, 123n is such that the duration of the assertion state of the sampling PLL control signal 123p is in integer multiple of the period of the VCO output signal 19 (FIG. 8). When phase lock is achieved, the sampling PLL 10 aligns a rising edge of the VCO output signal 19 with its sampling edge 123s, while the DLL 110 aligns its sampling edge, i.e., the falling edge of its control signal 123n, with another rising edge of the VCO output signal 19. Since these control signals 123p, 123n are complementary, the DLL 110 also aligns the rising edge of the sampling PLL control signal 123p with the rising edge of the VCO output signal 19. As a result, both the rising and falling edges of the sampling PLL control signal 123p are phased aligned to a rising edge of the VCO output signal 19. This ensures that the switch on-time (duration of assertion) of the sampling PLL control signal 123p (and similarly the DLL sampling control signal 123n) is defined to be an integer multiple of the period of the VCO output signal 19.

As will be readily appreciated, the additional delay of the inverter circuitry 134 can be compensated in the signal path for the sampling PLL control signal 123p by adding a transmission gate in series (not shown). Since the DLL 110 controls the rising edge of the sampling PLL control signal 123p, which is not the sampling edge, the DLL 110 will not add noise nor disturb the operation of the sampling PLL 110.

By adding the DLL 110, the capacitance loading the VCO 18 is kept constant over time. The sampling phase detectors 12, 112 should be substantially the same. With complementary sampling control signals 123p, 123n, the sampling operations of the sampling phase detectors 12, 112 are mutually exclusive, i.e., when one sampling phase detector is on, the other sampling phase detector is off. As a result, the VCO 18 is always loaded by one sampling phase detector, and such loading does not change with switching. Further, any charge injection from the switch in one sampling phase detector will be largely absorbed by the switched capacitance in the other sampling phase detector, and will cause minimal disturbance to operation of the VCO 18.

Referring to FIG. 10, the direct path current conduction through the inverting buffer circuit 132 can be minimized by a proper choice of the timing within the pulser circuit 130. When the incoming reference signal 21 is higher than the NMOS transistor 132n threshold voltage, the NMOS transistor is turned on. When the pulser output signal 131 is lower than the difference between the power supply voltage VDD and the PMOS transistor 132p threshold voltage, the PMOS transistor 132p is turned on. By an appropriate choice of the pulser delay 131d and the pulse with 131w, it can be ensured that the conduction, or turned on, times of the NMOS 132n and PMOS 132p transistors are mutually exclusive, i.e., non-overlapping. This eliminates direct path current conduction through the inverting buffer circuitry 132, thereby significantly reducing power consumption of the buffer circuitry 132.

Figure 11:
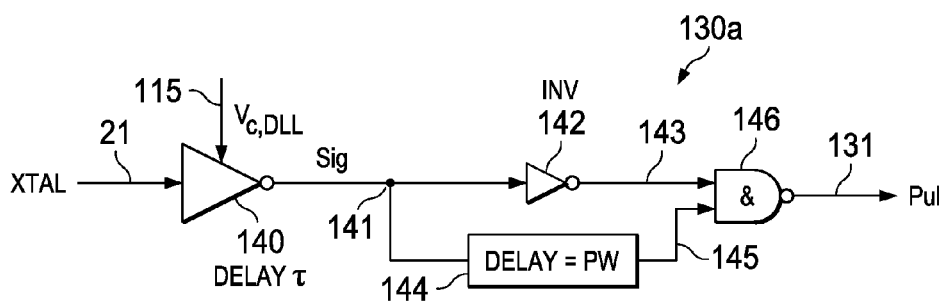
FIG. 11 is a schematic diagram of an exemplary embodiment of the pulser circuitry of FIG. 9.

Referring to FIG. 11, an example of the pulser circuitry 130 (labeled 130a) is shown. Pulser circuitry 130a includes inverter circuitry 140 with a controllable delay in accordance with the DLL output signal 115, additional inverter circuitry 142, additional delay circuitry 144 and signal combining circuitry 146 in the form of a logical NAND gate. The delay of the input inverter circuitry 140 can be tuned using well-known techniques, such as adding tunable shunt capacitances to the output circuitry of the inverter 140, or tuning charging or discharging current within the inverter circuitry 140. This controllable delayed signal 141 is inverted by the second inverter circuitry 142 and delayed by the second delay circuitry 144, with the resulting inverted 143 and delayed 145 signals being combined by the logic gate 146 to produce the pulsed signal 131.

Figure 12:
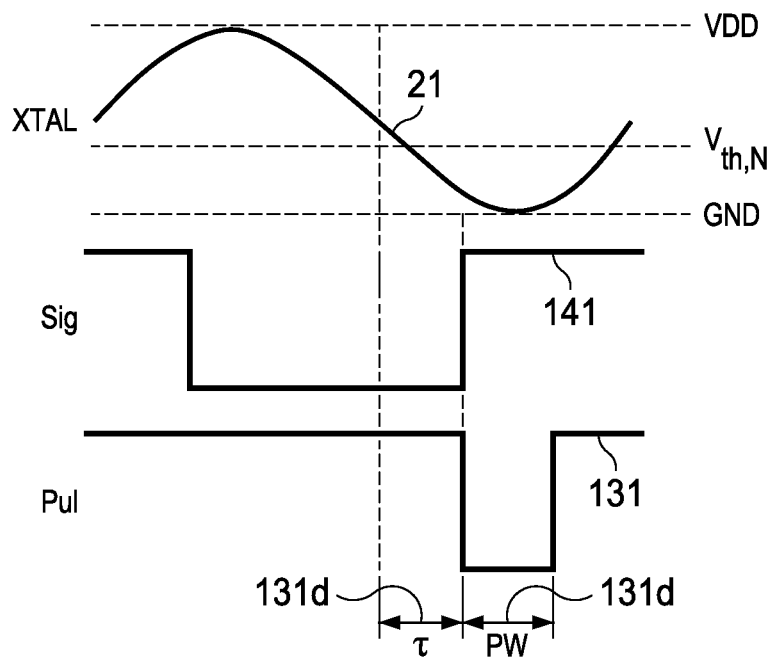
FIG. 12 is a signal timing diagram for the circuitry of FIG. 11.

Referring to FIG. 12, such operation of this circuitry 130a produces the pulsed signal 131 with the delay 131d and pulse width 131w as discussed above.

Figure 13:
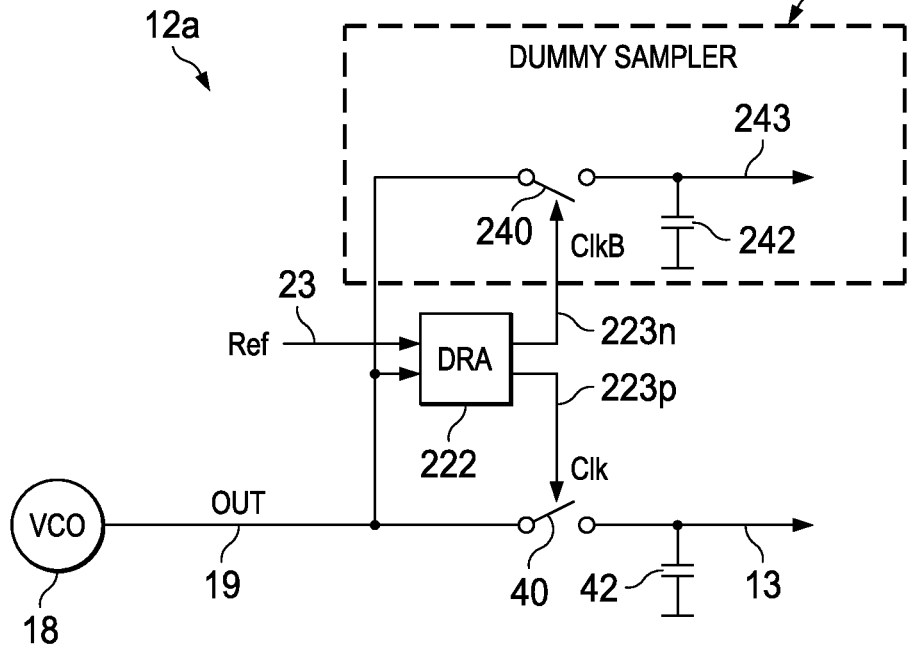
FIG. 13 is a schematic diagram of sampling control circuitry in accordance with another exemplary embodiment.

Referring to FIG. 13, an example of control circuitry for the sampling PLL 10 includes sampling control circuitry in the form of duty ratio adjustment (DRA) circuitry 222. Specifically, an example of the sampling phase detector 12 (labeled 12a) is shown. This control circuitry 222 (discussed in more detail below) processes the buffered reference signal 23 and VCO output signal 19 to produce the sampling control signal 223p for controlling the samplings switch 40 such that the duration of the asserted state of this control signal 223p is equal to an integer multiple of the period of the VCO output signal 19, as discussed above with reference to FIG. 8.

As shown in this example, a dummy sampler circuit 212 can be included which receives a switch control signal 223n from the sampling control circuitry 222 to control a sampling switch 240 for also sampling the VCO output signal 19. This switch control signal 223n is complementary to the switch control signal 223p for the sampler 12a. By the including the dummer sampler 212, which is driven by a sampling control signal 223n complementary to the sampling control signal 223p of the sampling PLL 10, the VCO 18 will always be loaded by one sampler 12a, 212 since one switch is always on while another switch is always off, similar to the discussion above for the complementary sampling phase detectors 12, 112 of FIG. 7.

Figure 14:
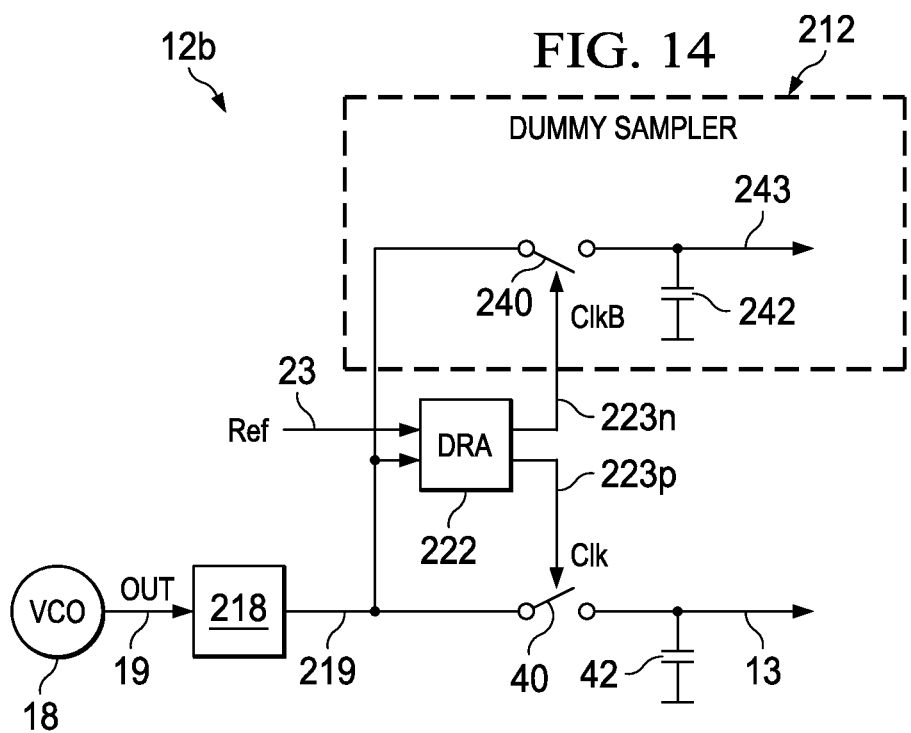
FIG. 14 is a schematic diagram of sampling control circuitry in accordance with another exemplary embodiment.

Referring to FIG. 14, a further alternative example of the sampling phase detector 12 (labeled 12*b*) is shown. The detector 12*b* has the same general configuration as detector 12*a*, but includes a series resistance 218 at the output of the VCO 18. Such resistance 218 helps compensate for the difference in the on-resistances of the switches 40, 240, which can affect the loading of the VCO 18 as much as the charging and discharging of the sampling capacitances 42, 242 through the switches 40, 240. As is well known, the transient behavior of the charging and discharging is governed by the RC time constant, and MOS transistors used as switches often have bad matching properties, particularly as the switching transistor size is often desired to be small for minimal parasitic capacitances and low charge injection. Accordingly, this additional series resistance 218 is larger than the on-resistance of the switches 40, 240, and is, therefore, the primary controlling factor in the RC time constant. This results in better matching and more consistent loading for the VCO 18, and, therefore, better prevention of output spurious signals.

Figure 15:
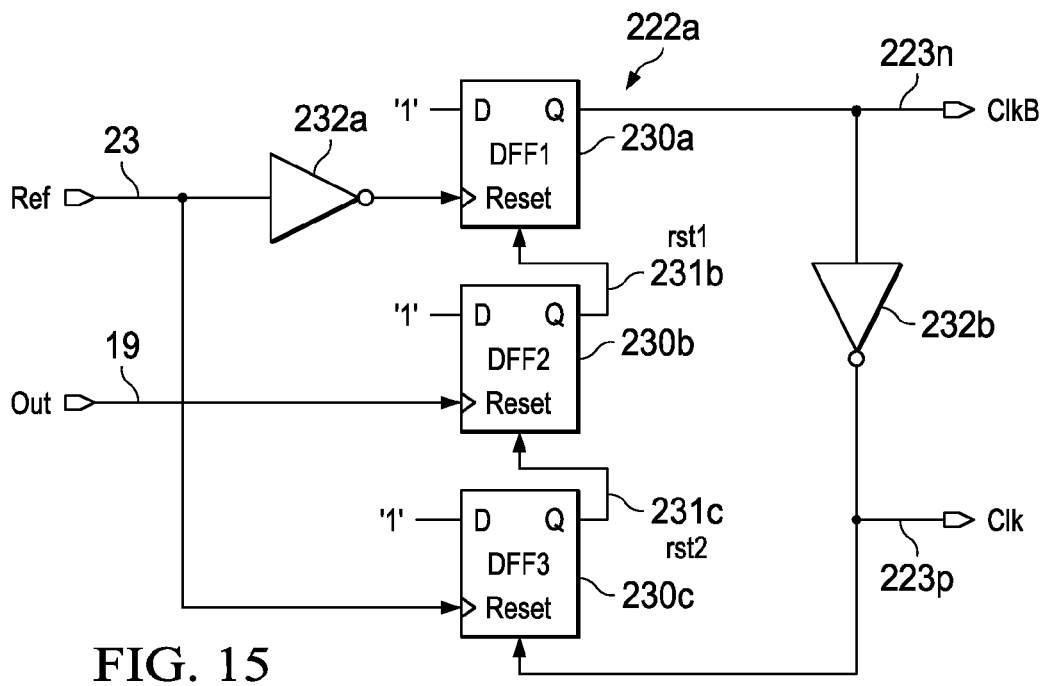
FIG. 15 is a schematic diagram of an exemplary embodiment of the sampling control circuitry of FIGS. 13 and 14.

Referring to FIG. 15, an exemplary embodiment 222*a* of the sampling control signal 222 is implemented using synchronous logic circuitry. In accordance with a preferred embodiment, this synchronous logic circuitry includes a plurality of D-type flip-flops 230*a*, 230*b*, 230*c*, plus logic inverters 232*a*, 232*b*. The data inputs D are tied high, while the Q outputs 231*c*, 231*b*, 223*n* serve as reset signals, with one Q output signal 223*n* serving as the complementary sampling control signal 223*n*, which is inverted to provide the primary sampling control signal 223*p*. The buffer reference signal 23 and VCO output signal 19 serve as clock signals for the flip-flops 230*a*, 230*b*, 230*c*, as shown.

Figure 16:
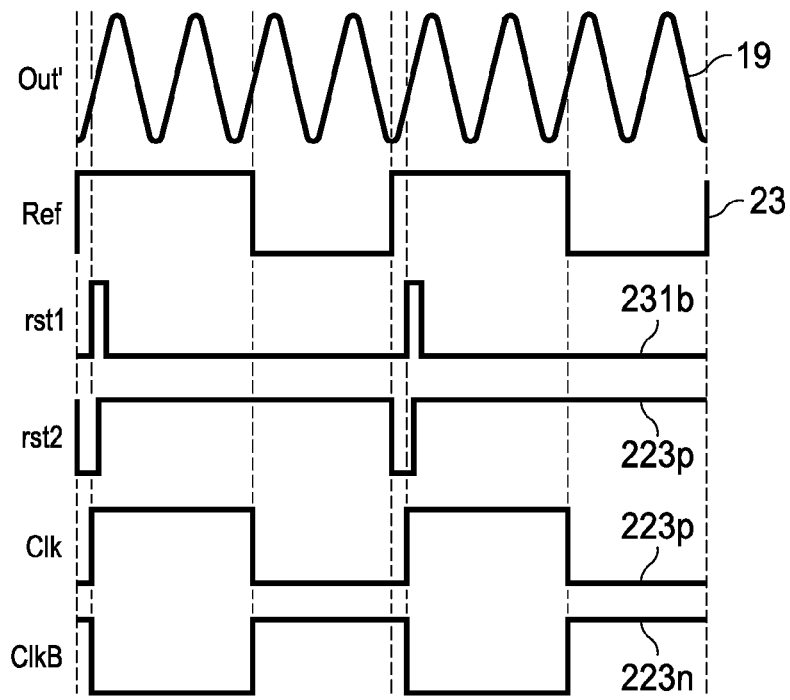
FIG. 16 is a signal timing diagram for the circuitry of FIG. 15.

Referring to FIG. 16, the relative phase relationships of the VCO output 19, buffered reference 23, reset 231*b*, 231*c* and switch control 223*p*, 223*n* signals are produced as a result of such signal interconnections. As discussed above, the switch control signals 223*p*, 223*n* are complementary and have asserted states with durations equal to an integer multiple of the period of the VCO output signal 19.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

The invention claimed is:

1. A circuit, comprising:
   a sampling phase locked loop (PLL) circuit configured to generate a PLL output clock phase locked to a reference clock, wherein the sampling PLL circuit includes a sampling phase detector circuit that is coupled to receive the PLL output clock, and that is responsive to a sampling control signal to generate a PLL control signal used to phase lock the PLL output clock to the reference clock; and
   a buffer circuit that is configured to receive the reference clock, and that is configured to generate the sampling control signal with a substantially square wave duty cycle defined by a sampling edge and a signal edge which establish a sampling duration, the buffer circuit including:
      a first transistor of a first type and a second transistor of a second type coupled in series in a pull-up pull-down arrangement with a buffer output node between the transistors, the transistors characterized by respective threshold voltages; and
      a pulser circuit receiving the reference clock and configured to generate a switch control pulse characterized by a switch-on edge and a pulse width;
      wherein the first transistor is configured to receive at its control input the reference clock, and the second transistor receiving at its control input the switch control pulse; and
      wherein the pulser circuit is configured to introduce a controlled delay in the switch-on edge of the switch control pulse relative to the reference clock cycling through the threshold voltage of the second transistor, and to control the pulse width of the switch control pulse; and
   wherein the buffer circuit is configured such that:
      the first transistor switches on in response to the reference clock cycling through its threshold voltage, thereby transitioning the buffer output node to generate the sampling edge of the sampling control signal;
      the second transistor switches on in response to the switch-on edge of the switch control pulse, thereby transitioning the buffer output node to generate the signal edge of the sampling control signal; and
      the switch-on edge and pulse width of the switch control pulse are controlled such that the first and second transistors are not on at the same time.

2. The circuit of claim 1, wherein:
   the first transistor is a pull-up transistor that switches on when the reference clock cycles above its threshold voltage;
   the second transistor is a pull-down transistor, and
   the pulser circuit generates the switch control pulse such that the control input of the second transistor is switched below its threshold voltage at the switch-on edge and switched above its threshold voltage at a switch-off edge corresponding to the pulse width.

3. The circuit of claim 1, wherein the pulser circuit is configured to introduce a controlled delay in a switch-off edge of the switch control pulse relative to the switch-on edge, thereby controlling the pulse width of the switch control pulse.

4. The circuit of claim 1:
   further comprising a delay control circuit responsive to the sampling control signal and the PLL output clock to generate a delay control signal;
   wherein the pulser circuit is responsive to the delay control signal to correspondingly delay the switch-on edge of the switch control pulse;
   wherein the pulser circuit is configured to introduce a controlled delay in a switch-off edge of the switch control pulse relative to the switch-on edge, thereby controlling the pulse width of the switch control pulse.

5. The circuit of claim 1,
   wherein the buffer circuit is configured to generate an inverse sampling control signal that is the inverse of the sampling control signal such that a sampling edge, a signal edge and a sampling duration of the inverse sampling control signal correspond respectively to the signal edge, the sampling edge and the sampling duration of the sampling control signal;

wherein the sampling PLL circuit includes a delay locked loop (DLL) circuit including a second sampling phase detector circuit coupled to receive the PLL output clock and responsive to the inverse sampling control signal to sample the PLL output clock at the associated sampling edge and provide a DLL control signal; and wherein the pulser circuit is responsive to the DLL control signal to correspondingly delay the switch-on edge of the switch control pulse, thereby controlling the signal edge of the sampling control signal corresponding to the sampling edge of the inverse sampling control signal, such that the sampling duration of the sampling control signal is substantially an integer multiple of the period of the PLL output signal.

6. The circuit of claim 5, wherein the pulser circuit is configured to introduce a controlled delay in a switch-off edge of the switch control pulse relative to the switch-on edge, thereby controlling the pulse width of the switch control pulse.

7. The circuit of claim 1, wherein the sampling PLL circuit further comprises:
   a charge pump circuit coupled to the sampling phase detector circuit and responsive to the PLL control signal to generate a VCO control signal; and
   a voltage controlled oscillator (VCO) circuit configured to generate the PLL output clock and responsive to the VCO control signal to control the phase of the PLL output clock, and thereby phase lock to the PLL output signal to the reference clock.

8. A method, comprising:
   receiving an input reference signal at a buffer circuit that includes drain-coupled NMOS and PMOS transistors with an intermediate drain output node;
   generating first and second control signals by:
      inputting the reference signal to the gate of the NMOS transistor;
      inputting the reference signal to an adjustable delay circuit so as to generate a delayed reference signal;
      inputting the delayed reference signal to the gate of the PMOS transistor;
      providing an output from the drain output node as the first control signal; and
      inverting the first control signal to provide the second control signal;
   controlling the generation of a PLL output signal by a PLL based on the first control signal;
   controlling the generation of a DLL output signal by a DLL based on the PLL output signal the second control signal; and
   controlling the delay of the adjustable delay circuit with the DLL control signal such that the NMOS transistor and the PMOS transistor are not on at the same time.

9. The method of claim 8, wherein generating the delayed reference signal comprises:
   inputting the reference signal to an inverter circuit having a delay controlled by the DLL control signal; and
   generating a pulse from an output of the inverter circuit corresponding to a delayed reference signal.

10. The method of claim 9, wherein generating the pulse comprises:
   inverting the output of the inverter circuit to generate a first intermediate signal;
   delaying the first intermediate signal to generate a second intermediate signal; and
   logically combining the first and second intermediate signals to generate the pulse.

11. The method of claim 8:
   wherein the first control signal comprises a sampling pulse with a sampling edge and a signal edge which define a sampling duration;
   wherein controlling the generation of the PLL output signal comprises: sampling, in a PLL, a PLL output signal based on the first control signal such that the PLL output signal is phase locked to the sampling edge of the first control signal; and
   wherein controlling the generation of the DLL output signal comprises: sampling, in a DLL, the PLL output signal based on the second control signal so as to generate a DLL control signal.

12. The method of claim 11: wherein the delay of the adjustable delay circuit is controlled such that:
   the PLL output signal is phase locked by the DLL with the sampling edge of the second control signal, which corresponds to the signal edge of the first control signal, such that the sampling duration of the first control signal is substantially an integer multiple of the period of the PLL output signal; and
   the NMOS transistor and the PMOS transistor are not on at the same time.

13. The method of claim 8, wherein controlling the generation of a PLL output signal by a PLL based on the first control signal comprises:
   generating, in a PLL with a VCO, a VCO control signal based on the first control signal; and
   generating, by the VCO, a PLL output signal phase locked to the reference signal based on the VCO control signal.

14. A system, comprising
   a circuit configured to perform logic operations based on a PLL clock at a specified clock frequency;
   a sampling PLL circuit configured to generate the PLL clock from a reference clock, the sampling PLL circuit operable to phase align the PLL clock with the reference clock; and
   an oscillator circuit generating the reference clock;
   the sampling PLL circuit having:
      a sampling phase detector circuit coupled to receive the PLL output clock, and responsive to a sampling control signal to generate a PLL control signal used to phase lock the PLL output clock to the reference clock; and
      a buffer circuit receiving the reference clock, and configured to generate the sampling control signal with a substantially square wave duty cycle defined by a sampling edge and a signal edge which establish a sampling duration, the buffer circuit having:
         a first transistor of a first type and a second transistor of a second type coupled in series in a pull-up pull-down arrangement with a buffer output node between the transistors, the transistors characterized by respective threshold voltages;
         a pulser circuit receiving the reference clock and configured to generate a switch control pulse characterized by a switch-on edge and a pulse width;
         the first transistor receiving at its control input the reference clock, and the second transistor receiving at its control input the switch control pulse;
      wherein the pulser circuit is configured to introduce a controlled delay in the switch-on edge of the switch control pulse relative to the reference clock cycling through the threshold voltage of the second transistor, and to control the pulse width of the switch control pulse; and wherein the buffer circuit is configured such that:
the first transistor switches on in response to the reference clock cycling through its threshold voltage, thereby transitioning the buffer output node to generate the sampling edge of the sampling control signal;
the second transistor switches on in response to the switch-on edge of the switch control pulse, thereby transitioning the buffer output node to generate the signal edge of the sampling control signal, and
the switch-on edge and pulse width of the switch control pulse are controlled such that the first and second transistors are not on at the same time.

15. The system of claim 14, wherein:
the first transistor is a pull-up transistor that switches on when the reference clock cycles above its threshold voltage;
the second transistor is a pull-down transistor, and
the pulser circuit generates the switch control pulse such that the control input of the second transistor is switched below its threshold voltage at the switch-on edge and switched above its threshold voltage at a switch-off edge corresponding to the pulse width.

16. The system of claim 14, wherein the pulser circuit is configured to introduce a controlled delay in a switch-off edge of the switch control pulse relative to the switch-on edge, thereby controlling the pulse width of the switch control pulse.

17. The system of claim 14:
further comprising a delay control circuit responsive to the sampling control signal and the PLL output clock to generate a delay control signal;
wherein the pulser circuit is responsive to the delay control signal to correspondingly delay the switch-on edge of the switch control pulse;
wherein the pulser circuit is configured to introduce a controlled delay in a switch-off edge of the switch control pulse relative to the switch-on edge, thereby controlling the pulse width of the switch control pulse.

18. The system of claim 14,
wherein the buffer circuit is configured to generate an inverse sampling control signal that is the inverse of the sampling control signal such that a sampling edge, a signal edge and a sampling duration of the inverse sampling control signal correspond respectively to the signal edge, the sampling edge and the sampling duration of the sampling control signal;
wherein the sampling PLL circuit includes a DLL circuit including a second sampling phase detector circuit coupled to receive the PLL output clock and responsive to the inverse sampling control signal to sample the PLL output clock at the associated sampling edge (corresponding to the signal edge of the sampling control signal) and provide a DLL control signal; and
wherein the pulser circuit is responsive to the DLL control signal to correspondingly delay the switch-on edge of the switch control pulse, thereby controlling the signal edge of the sampling control signal, such that the sampling duration of the sampling control signal is substantially an integer multiple of the period of the PLL output signal.

19. The system of claim 18, wherein the pulser circuit is configured to introduce a controlled delay in a switch-off edge of the switch control pulse relative to the switch-on edge, thereby controlling the pulse width of the switch control pulse.

20. The system of claim 14 wherein the sampling PLL circuit further comprises:

a charge pump circuit coupled to the sampling phase detector circuit and responsive to the PLL control signal to generate a VCO control signal; and
a VCO circuit configured to generate the PLL output clock and responsive to the VCO control signal to control the phase of the PLL output clock, and thereby phase lock to the PLL output signal to the reference clock.

21. A circuit, comprising:
an oscillator;
a buffer circuit having
an adjustable delay circuit coupled to the oscillator;
an inverting buffer coupled to the adjustable delay circuit and the oscillator; and
an inverter coupled to the output of the inverting buffer;
a PLL having an input and an output, wherein the input of the PLL is coupled to the output of the inverting buffer; and
a DLL coupled to the output of the PLL and the inverter;
wherein the DLL is configured to control the adjustable delay circuit.

22. The circuit of claim 21;
wherein the inverting buffer includes series coupled first and second transistors, the first transistor having its control input coupled to the oscillator, the second transistor having its control input coupled to the adjustable delay circuit, and the first and second transistors coupled at an intermediate node that provides the output of the inverting buffer; and
wherein the adjustable delay circuit is configured to control the second transistor such that the first and second transistors are not on at the same time.

23. The circuit of claim 21, wherein the inverting buffer further comprises:
a PMOS transistor coupled to the adjustable delay circuit at its gate; and
an NMOS transistor coupled to the oscillator at its gate;
wherein the PMOS transistor and the NMOS transistor are series coupled at respective drains, providing an intermediate output node coupled to the PLL and through the inverter to the DLL.

24. The circuit of claim 23, wherein the adjustable delay circuit further comprises:
a controlled-delay inverter coupled to the oscillator and the DLL; and
a pulser circuit coupled between the controlled-delay inverter and the gate of the PMOS transistor.

25. The circuit of claim 24, wherein the input of the PLL is a first input of the PLL, and wherein the PLL further comprises:
a sampling phase detector having the first input and a second input of the PLL;
a charge pump coupled to the sampling phase detector;
a filter coupled to the charge pump; and
a VCO coupled to the filter, wherein the VCO includes the output of the PLL, and wherein the output of the PLL is couple to the second input of the PLL.

26. The apparatus of claim 25, wherein the sampling phase detector is a first sampling phase detector, and wherein the charge pump is a first charge pump, and wherein the filter is a first filter, and wherein the DLL further comprises:
a second sampling phase detector coupled to the first inverter and the output of the PLL;
a second charge pump coupled to the second sampling phase detector; and
a second filter coupled between the second charge pump and the second inverter.

* * * * *